(12) United States Patent
Piret

(10) Patent No.: US 6,993,698 B2
(45) Date of Patent: Jan. 31, 2006

(54) TURBOCODING METHODS WITH A LARGE MINIMUM DISTANCE, AND SYSTEMS FOR IMPLEMENTING THEM

(75) Inventor: Philippe Piret, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 525 days.

(21) Appl. No.: 09/964,657

(22) Filed: Sep. 28, 2001

(65) Prior Publication Data

US 2002/0099997 A1    Jul. 25, 2002

(30) Foreign Application Priority Data

Oct. 10, 2000 (FR) ................................ 00 12939

(51) Int. Cl.
*H03M 13/29* (2006.01)
(52) U.S. Cl. .................................... 714/755
(58) Field of Classification Search ............... 714/706, 714/755
See application file for complete search history.

(56) References Cited

U.S. PATENT DOCUMENTS

| | | | | |
|---|---|---|---|---|
| 5,905,739 | A | 5/1999 | Piret et al. | 371/37.01 |
| 6,370,670 | B1 * | 4/2002 | Le Dantec et al. | 714/781 |
| 6,543,021 | B1 | 4/2003 | Piret | 714/752 |
| 6,560,362 | B1 * | 5/2003 | Piret et al. | 382/232 |
| 6,578,170 | B1 * | 6/2003 | Piret et al. | 714/758 |
| 6,578,171 | B1 * | 6/2003 | Braneci et al. | 714/786 |
| 6,625,762 | B1 * | 9/2003 | Le Dantec | 714/701 |
| 6,638,318 | B1 * | 10/2003 | Piret et al. | 714/781 |
| 6,766,489 | B1 | 7/2004 | Piret et al. | 371/37.01 |
| 2004/0117719 | A1 | 6/2004 | Piret | 714/751 |

FOREIGN PATENT DOCUMENTS

EP    0928071 A1    7/1999

OTHER PUBLICATIONS

McEliece et al., "Permutations Preserving Divisibility", IEEE Transactions on Information Theory, vol. 47, No. 3, Mar. 2001.*
Wang, et al., "Interleaver Design for Turbo Codes Based on Divisibility", ITW 1999, p. 58.*
Barbulescu A. S., et al., "Terminating the trellis of turbo-codes in the same state", Electronics Letters, vol. 31, No. 1, Jan. 5, 1995, pp. 22-23.
Blackert W. J., et al., "Turbo code termination and interleaver conditions", Electronics Letters, vol. 31, No. 24, Nov. 23, 1995, pp. 2082-2084.

(Continued)

*Primary Examiner*—Stephen M. Baker
(74) *Attorney, Agent, or Firm*—Fitzpatrick, Cella, Harper & Scinto

(57) ABSTRACT

Turbocoding methods use a first RSC coder operating on sequences of binary data $a$, and a second RSC coder operating on binary sequences $a^*$ each obtained from $a$ by means of a predetermined permutation. These permutations are designed so that, for any sequence $a$ represented by a polynomial divisible by the recursion polynomial, the associated sequence $a^*$ is also represented by a polynomial divisible by the recursion polynomial. These permutations are relatively simple to implement, and are applicable to all the data sequences $a$ which have a length which is a multiple of the period of the recursion polynomial. In addition, once the transfer functions of the coders and the sequence length have been chosen, it is possible to select, amongst the corresponding permutations, the one which will probably offer the highest minimum distance of the code. Application to devices and apparatus implementing these methods.

11 Claims, 7 Drawing Sheets

OTHER PUBLICATIONS

Figure 1:
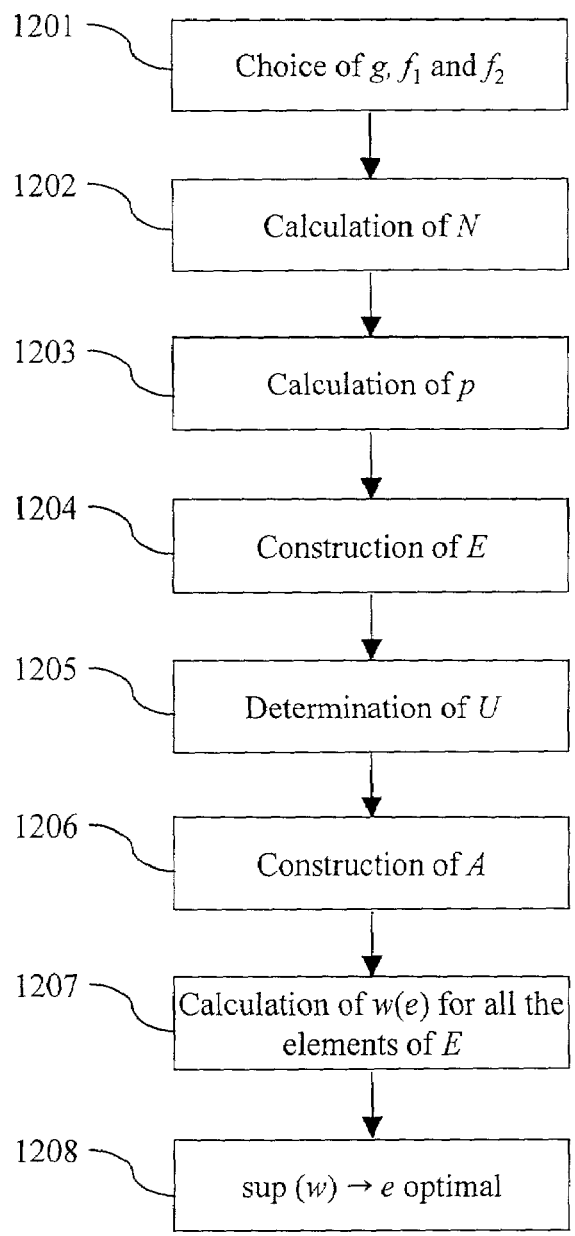

Divsalar D., et al., "Turbo Codes for PCS Applications", Proceedings of the International Conference on Communications (ICC), US, New York, IEEE, Jun. 1995, pp. 54-59.

Yung-Cheng Lo, et al., "High Dimensional Circular Trellis-Coded Modulation", Conference Record of the Thirty-First Asilomar Conference on Signals, Systems and Computers, Pacific Grove, CA, USA, 1998, pp. 560-564.

C. Berrou, et al., "Near Shannon Limit Error—Correcting Coding and Decoding: Turbo-Codes (I)", ICC '93, Geneva, IEEE pp. 1064-1070, 1993.

C. Berrou, et al., "Near Optimum Error Correcting Coding and Decoding: Turbo-Codes,", IEEE Transactions on Communications, vol. 44, No. 10, Oct. 1996, pp. 1261-1271.

J. Hagenauer, et al., "Iterative Decoding of Binary Block and Convolutional Codes", IEEE Transactions on Information Theory, vol. 42, No. 2, pp. 429-445, 1996.

A. Tannenbaum, "Computer Networks", 3$^{rd}$ Edition, Prentice-Hall International, New Jersey, 1996, pp. 184-186.

F.J. McWilliams et al., "The Theory of Error Correcting Codes", North-Holland 1992, pp. 82-109.

C. Berrou et al., "Turbo-Codes: General Principles and Applications", Audio and Video Digital Radio Broadcasting Systems and Techniques, Proceedings of the Sixth International Seminar of Tirrenia on Digital Communications, 1993, pp. 215-226.

C. Berrou et al., "Turbo-Block-Codes", Proceedings of the Seminar "Turbo-Coding" organized by the Applied Electronics Department of the Institute of Technology of Lund, Sweden, Aug., 1996, 7 pages.

L.R. Bahl et al., "Optimal Decoding of Linear Codes for Minimizing Symbol Error Rate", IEEE Transactions of Information Theory, Mar. 1974, pp. 284-287.

J. Hagenauer et al., "Iterative ('TURBO') Decoding of Systematic Convolutional Codes with the MAP and SOVA Algorithms", Proc. of the ITG- Conference, Source and Channel Coding, CDE—Verlag Frankfurt, Informationstechnische Gesellschaft (ITG) Fachbericht, pp. 21-29, Oct. 1994.

* cited by examiner

TURBOCODING METHODS WITH A LARGE MINIMUM DISTANCE, AND SYSTEMS FOR IMPLEMENTING THEM

The present invention concerns the communication systems in which, in order to improve the fidelity of the transmission, the data to be transmitted are subjected to a channel coding. It concerns more particularly a "turbocoding" method, as well as the devices and apparatus intended to implement this method.

It will be recalled that so-called "channel" coding consists, when the "code words" sent to the receiver are formed, of introducing a certain degree of redundancy in the data to be transmitted. At the receiver, the associated decoding method then judiciously uses this redundancy to detect any transmission errors and if possible to correct them. More precisely, the "Hamming distance" between two binary sequences of the same length is defined as the number of locations where the two sequences have a different binary element. The code words obey certain rules defined by the coding method in question, which enables the receiver to replace the word received with the "legal" code word situated at the shortest Hamming distance from this received word.

It is clear that this error correction procedure is more reliable, the greater the minimum Hamming distance between the various code words. It will be noted that the distance between a given code word and the "null" code word (the one where all the binary elements are zero) is equal to the number of binary elements equal to 1, called the "binary weight", of this given code word. It is deduced from this that, all other things being equal, the higher the minimum value of the binary weight of the code words (excluding the null word), the better the coding method. For more details, reference should be made for example to the book "Computer Networks" by A. Tannenbaum, 3$^{rd}$ edition, Prentice-Hall International, New Jersey, 1996, page 184.

In particular, the coding methods known as "cyclic redundancy codes" are known. In each of them, the choice has been made of a polynomial g(x), referred to as the "generator polynomial", with binary coefficients, of degree d and with a constant term equal to 1. Each sequence of information to be transmitted is, possibly by extending it with zero elements, put in the form of a binary sequence $\underline{u}$ having a fixed length k. Then a sequence a is formed by extending the sequence $\underline{u}$ by means of a number of bits equal to d, these so-called padding bits being chosen so that the polynomial $$a(x) = \sum_{i=0}^{k+d-1} a_i x^i$$

associated with $\underline{a}$ is divisible by g(x) (modulo 2). It is the sequences $\underline{a}$ (of length p=k+d) which are sent to the receiver. The transmission errors are then detected by examining the remainder of the division of the code word received by the generator polynomial (see for example A. Tannenbaum, op. cit., pages 187–188).

Recently very effective coding methods have been proposed, known as "turbocodes", in which the redundancy is increased by transmitting, for each sequence $\underline{u}$ of initial data, not just one but three binary sequences $\underline{a}$, $\underline{b}$ and $\underline{c}$, obtained as explained below. The turbocodes form part of so-called "convolutional" codes, that is to say codes in which each bit entering a coder is combined with other bits temporarily recorded in this coder, these temporarily recorded bits having been produced by the processing, in the coder, of the previous incoming bits; because of this, the result of the coding of a sequence entering a convolutional coder depends in general on the sequences previously processed.

The sequence $\underline{b}$ which has just been mentioned is obtained by means of a device which will be referred to as the "first coder", normally on the basis of the polynomial representation $$b(x)=a(x) \cdot f_1(x)/g(x),$$

where a(x) is the polynomial associated with the sequence $\underline{a}$, g(x) a first predetermined polynomial with binary coefficients of degree d and with a constant term equal to 1, and $f_1(x)$ a second predetermined polynomial with binary coefficients without a common divisor with g(x). The polynomial g(x) is called the "recursion polynomial" because of its appearance at the denominator of the above expression.

As for the sequence $\underline{a}$, it can be taken to be identical to $\underline{u}$, but is often obtained, as in the "cyclic redundancy codes", by extending the sequence $\underline{u}$ by means of padding bits chosen so that a(x) is divisible by g(x). This is because, as is known to experts, this divisibility is a necessary condition for guaranteeing the same quality of decoding for the last bits in each sequence as for the other bits.

The sequence $\underline{c}$, finally, is obtained by means of a device which will be called the "second coder", normally on the basis of the polynomial representation $$c(x)=a^*(x) \cdot f_2(x)/g^*(x),$$

where g*(x) is a third predetermined polynomial with binary coefficients of degree d and with a constant term equal to 1, where $f_2(x)$ is a fourth predetermined polynomial with binary coefficients, without a common divisor with g*(x), and where the polynomial a*(x) represents a binary sequence $\underline{a}^*$ which results in a predetermined manner from a permutation of the binary elements of $\underline{u}$ or $\underline{a}$ (an operation known as "interleaving").

The "turbodecoding" of the message transmitted functions in the following manner: the decoder receives three sequences of numbers, denoted a', b' and c', which have been produced by the action of the noise of the transmission channel on the transmitted sequences $\underline{a}$, $\underline{b}$ and $\underline{c}$. The turbodecoder then uses an iterative process (using $\underline{b}'$ and $\underline{c}'$ in alternation) intended to calculate an estimated value $\underline{\hat{a}}$ of $\underline{a}$ with a reliability which increases with the number of iterations chosen. If padding bits have been chosen, it is obviously sufficient, once the final value of $\underline{\hat{a}}$ has been obtained, to eliminate the last d bits therefrom in order to obtain the estimated value $\underline{\hat{u}}$ of $\underline{u}$.

The comments given above concerning the utility of the divisibility of the polynomials a(x) by the polynomial g(x) at the first coder also apply to the second coder, for which there is posed the problem of the divisibility of the polynomials a*(x) by the recursion polynomial g*(x), this problem having to be resolved in the context where each of these polynomials a*(x) comes from a polynomial a(x) divisible by g(x). A known solution consists, firstly, of permuting in a predetermined manner the binary elements of $\underline{u}$ in order to obtain a sequence $\underline{u}^*$, and, secondly, forming $\underline{a}^*$ by extending $u^*$ by means of d padding bits so that $a^*(x)$ is divisible by $g^*(x)$ (then $g^*(x)$ will preferably be chosen so as to be identical to $g(x)$ for reasons of simplicity); however, such a turbocoding method has the drawback that the efficacy of the turbodecoding is not ideal because of the fact that $a$ and $a^*$ contain sets of padding bits chosen independently of each other; the result is a certain loss of reliability (measured in terms of error rates) in the transmission.

The patent application EP 0 928 071, in the name of Canon, resolves this tricky problem by means of interleavers in which the sequence $a^*$ is obtained directly by permutation of the binary elements of $a$. More precisely, $a^*$ has been represented by the polynomial $$a^*(x) = \sum_{i=0}^{p-1} a_i x^{\pi(i)},$$

where $\pi(i)$ belongs to a certain class of permutations of the integers i lying between 0 and (p−1); for each of these interleavers, it is always possible to find a polynomial $g^*(x)$ such that, whatever the polynomial $a(x)$ divisible by $g(x)$, the polynomial $a^*(x)$ is also divisible by $g^*(x)$. Thus, once the sequence $a$ has been formed, additional padding bits do not have to be added to obtain $a^*$.

In addition to a high minimum distance, a second quality sought for a coding method is obviously its simplicity of implementation, that is to say the simplicity of the algorithm employed, with regard to both the coding and the associated decoding.

To this end, the document EP 0 928 071 mentioned above presents a particular example of permutation belonging to said class of permutations preserving divisibility: there the residue modulo p of the product (i·e), where e is a predetermined strictly positive integer number, relatively prime with p and congruent with a power of 2 modulo p, is taken for $\pi(i)$; as a result $g^*(x)$ is simply equal to $g(x)$.

This interleaver, which has the merit of simplicity, does however have the drawback of requiring that the length p of the sequences $a$ and $a^*$ be an odd multiple of the period of the recursion polynomial (the period of a polynomial $g(x)$ is defined as being the smallest positive integer N such that said polynomial $g(x)$ divides $(x^N+1)$ modulo 2; for other properties already known of the said period, it is possible to consult the classic work by F. J. McWilliams and N. J. A. Sloane entitled "*The Theory of Error-Correcting Codes*", published by North-Holland in 1977, the seventh edition of which appeared in 1992).

To allow a greater choice in the length of said sequences whilst preserving the advantages offered by the interleavers according to EP 0 928 071, the invention proposes a turbocoding method for the transmission of information in which, a first polynomial with binary coefficients $g(x)$ of degree d and with a constant term equal to 1 having been predetermined, first of all said information is presented in the form of binary sequences $u$ of length k=p−d, where p is a predetermined multiple of the period N of the polynomial $g(x)$, and then, for each of said sequences $u$, there is produced a triplet $v$ of binary sequences $(a, b, c)$ intended to be transmitted and obtained as follows:

said sequence $a$ is of length p and obtained by extending the sequence $u$ by means of d "padding" bits so that the polynomial $$a(x) = \sum_{i=0}^{p-1} a_i x^i$$

associated with $a$ is divisible by $g(x)$, said sequence $b$ is represented by the polynomial $b(x)=a(x)\cdot f_1(x)/g(x),$ where $f_1(x)$ is a second polynomial with predetermined binary coefficients, without a common divisor with $g(x)$, and said sequence $c$ is represented by the polynomial $c(x)=a^*(x)\cdot f_2(x)/g^*(x),$ where $$a^*(x) = \sum_{i=0}^{p-1} a_i x^{\pi(i)},$$

where $\pi(i)$ is a predetermined permutation of the integers i lying between 0 and (p−1), where $g^*(x)$ is a third polynomial with predetermined binary coefficients, of degree d and with a constant term equal to 1, $\pi(i)$ and $g^*(x)$ being chosen so that, whatever the polynomial $a(x)$ divisible by $g(x)$, $a^*(x)$ is divisible by $g^*(x)$, and where $f_2(x)$ is a fourth polynomial with predetermined binary coefficients, without a common divisor with $g^*(x)$, characterized in that there is taken for $\pi(i)$ the residue modulo p of the product (i·e), where e is a predetermined strictly positive integer, relatively prime with p, congruent with a power of 2 modulo N, and not congruent with a power of 2 modulo p, from which it results that $g^*(x)$ is identical to $g(x)$.

Correlatively, the invention concerns a turbodecoding method, said method being remarkable in that it makes it possible to decode received sequences which have been transmitted after having been coded by means of a turbocoding method according to the invention.

Thus the turbocoding methods according to the invention, although not requiring any additional padding bits for obtaining the "interleaved" sequence $a^*$, are applicable to a wide range of lengths p of transmitted sequences (since M=p/N can be even or odd), whilst remaining relatively simple to implement.

In addition, the turbocoding methods according to the present invention, whilst fitting within the general context of permutations disclosed by EP 0 928 071, enable an expert to have access, where he chooses M odd, to a greater reservoir of values of the number e amongst which it is possible to choose an optimum value e*, by comparison with the particular example of permutation disclosed by EP 0 928 071 and mentioned above.

This is because this particular example of permutation already offers a fairly wide set of possible values for e, defined (amongst other criteria) by the fact that each number e in this set is congruent with a power of 2 modulo p. However, subsequent researches have enabled the inventor to have access to an additional reservoir of values of e defining, here too, permutations preserving divisibility: it is a case (amongst other criteria) of the integers congruent with a power of 2 modulo N which are not congruent with a power of 2 modulo p. Not only the new values of e thus revealed allow a practical implementation of a turbocoding with the same advantages as a turbocoding according to the example disclosed by EP 0 928 071, but also an expert will be able, according to the concrete conditions of implementation, to seek said optimum value e* both in the values of the known set and in the values of the additional reservoir supplied by the present invention.

It is notably desirable to use a code with a large minimum distance (as explained in the introduction, the minimum distance of the code fulfils an important role in the suitability of the code for detecting and correcting transmission errors). For this purpose, the same procedure will be followed for determining an optimum value e* of e:

a) a certain number of different sequences $u$ are chosen to form what will be referred to as the "representative set", b) for each strictly positive integer number e less than p, congruent with a power of 2 modulo N and relatively prime with p:

the total binary weight PB of all said triplets of binary sequences $v$ associated with the sequences $u$ belonging to said representative set is calculated, and note is taken of the value w(e), associated with this value of e, of the minimum weight amongst all these binary weights PB, and c) in order to implement the coding, the value e* of e which is associated with the largest value of this minimum weight w is chosen.

By virtue of these provisions, the codes according to the invention benefit from a relatively high minimum weight, whatever said predetermined polynomials chosen.

According to another of its aspects, the invention concerns various devices.

It thus concerns a device for coding sequences of data intended to be transmitted by means of a turbocoding method according to the invention, said device being remarkable in that it has:

means for obtaining, for each sequence of data $u$, said sequence $a$ associated with $u$ by extending the sequence $u$ by means of said d padding bits, and at least one turbocoder having an interleaver $\pi_1$ able to effect the permutation provided for in said method.

Correlatively, the invention concerns a decoding device intended to implement a turbodecoding method according to the invention, said device being remarkable in that it has:

at least one turbodecoder having two interleavers $\pi_1$ able to effect the permutation provided for in said method, and a deinterleaver $\pi_2$ able to reverse this permutation, and means for producing a binary sequence $û$ by removing the last d bits of the estimated sequence $â$ obtained at the end of the turbodecoding of the received sequences $a'$, $b'$ and $c'$ corresponding respectively to said transmitted sequences $a$, $b$, and $c$.

The present invention also relates to:

an apparatus for transmitting coded digital signals, having a coding device as succinctly described above, and having means for transmitting said coded sequences $a$, $b$, and $c$, an apparatus for receiving coded digital signals, having a decoding device as succinctly described above, and having means for receiving said sequences $a'$, $b'$, and $c'$, a telecommunications network, having at least one transmission apparatus or one reception apparatus for coded digital signals as succinctly described above, a data storage means which can be read by a computer or a microprocessor storing instructions of a computer program, making it possible to implement one of the methods according to the invention, a means of storing data which is removable, partially or totally, and which can be read by a computer and/or a microprocessor storing instructions of a computer program, making it possible to implement one of the methods according to the invention, and a computer program, containing instructions such that, when said program controls a programmable data processing device, said instructions mean that said data processing device implements one of the methods according to the invention.

The advantages offered by these devices, digital signal processing apparatus, telecommunications network, data storage means and computer programs are essentially the same as those offered by the methods according to the invention.

Figure 2:
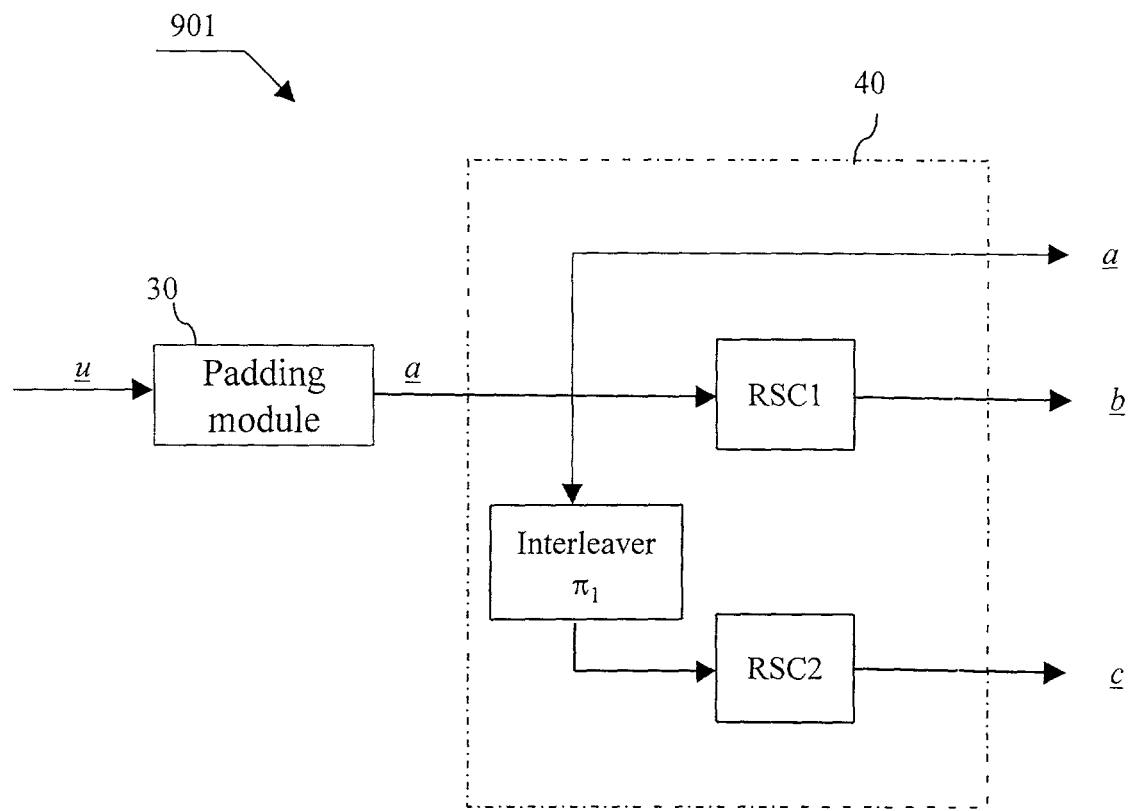
Figure 7:
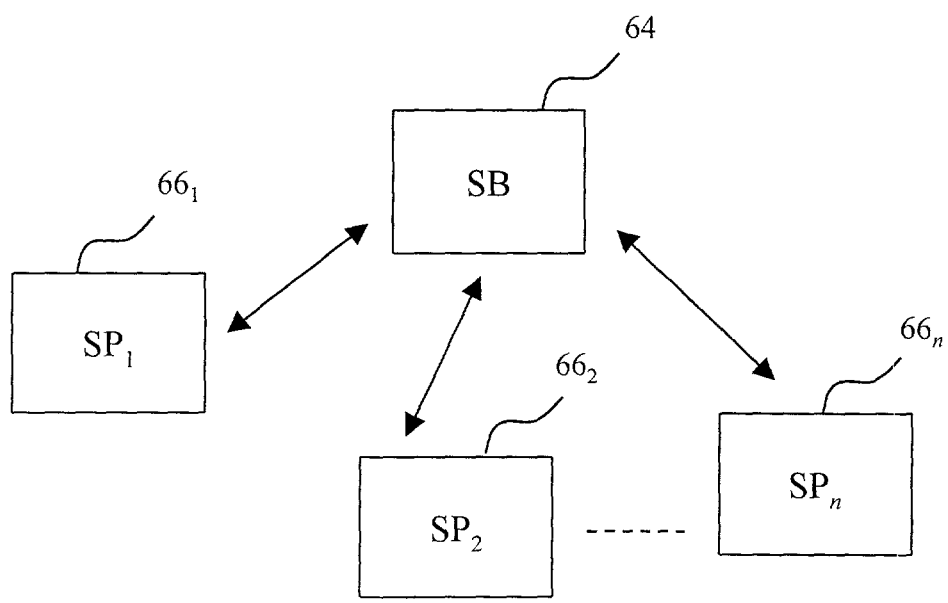
Figure 3A:
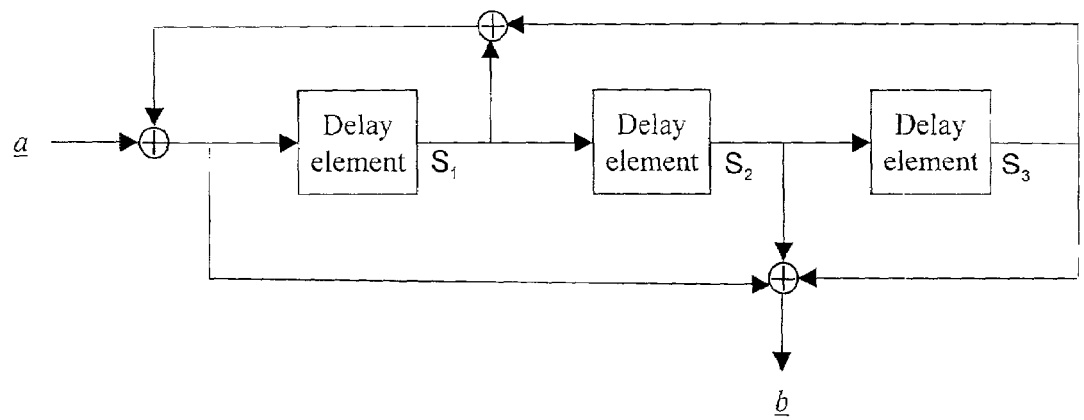
Figure 3B:
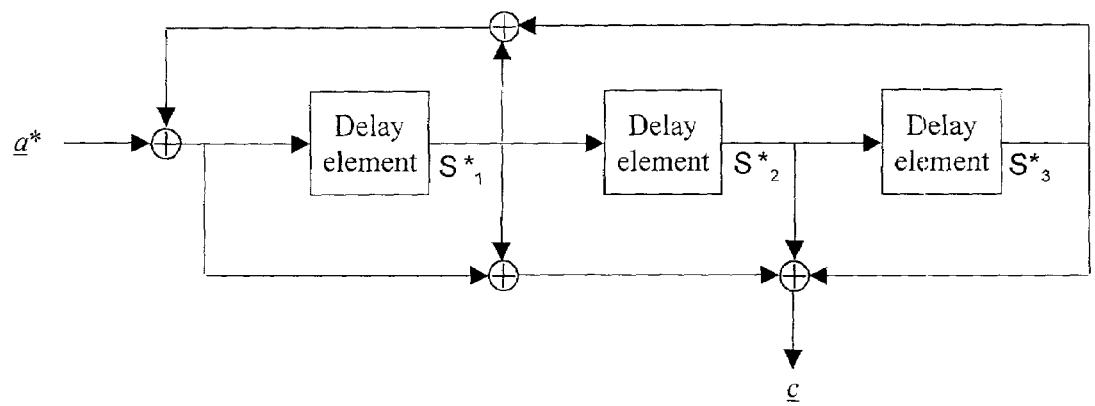
Figure 4:
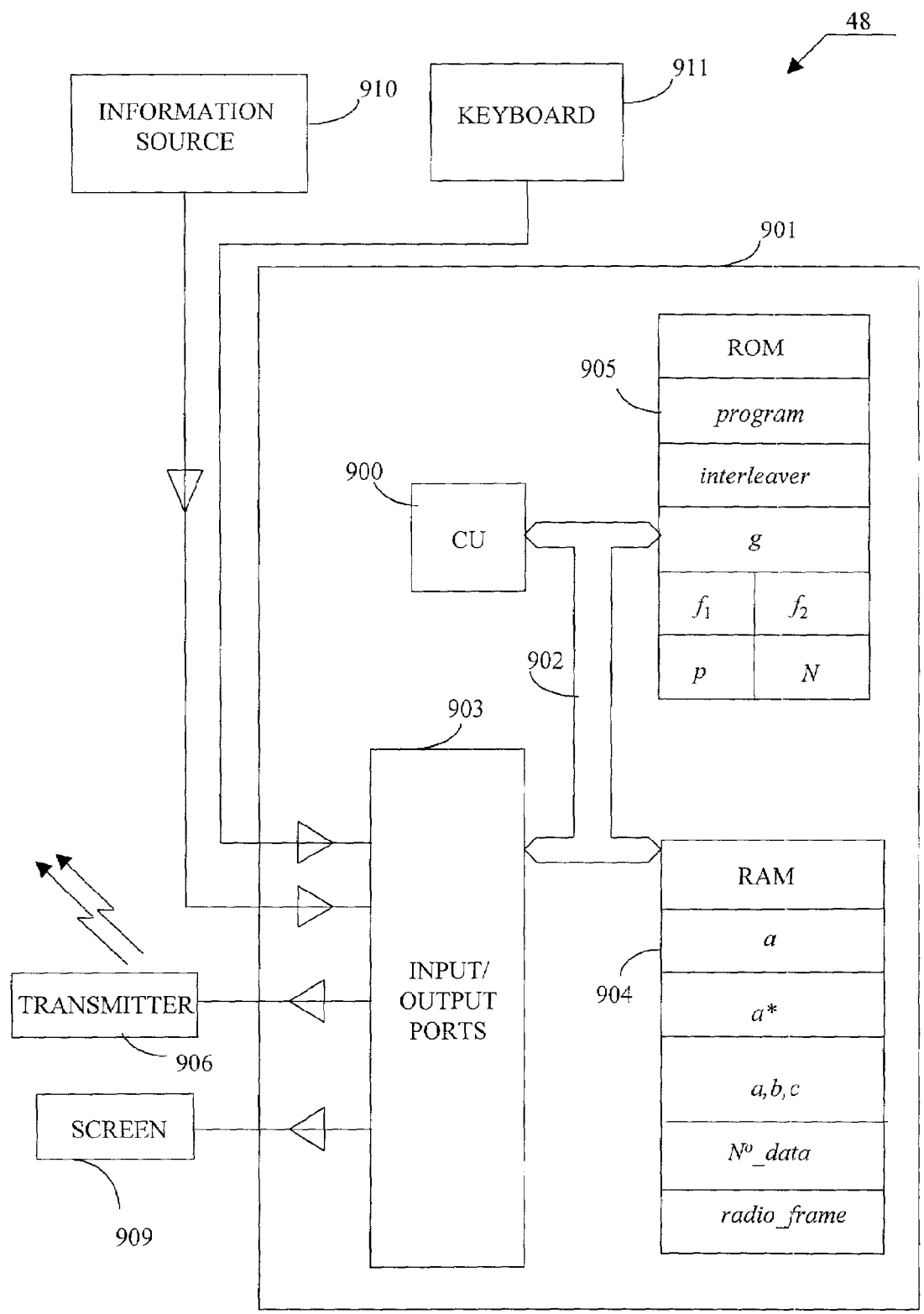
Figure 5:
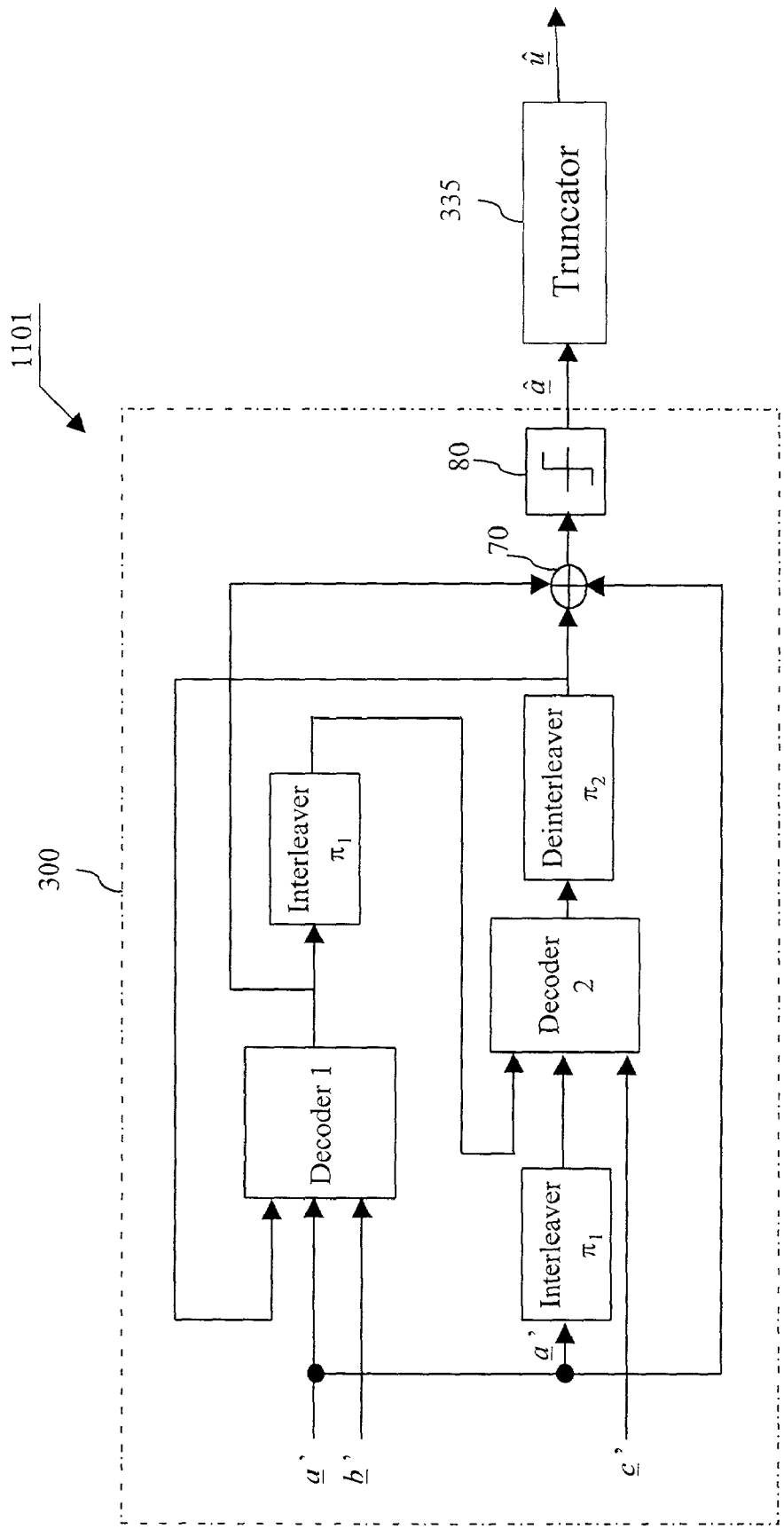
Figure 6:
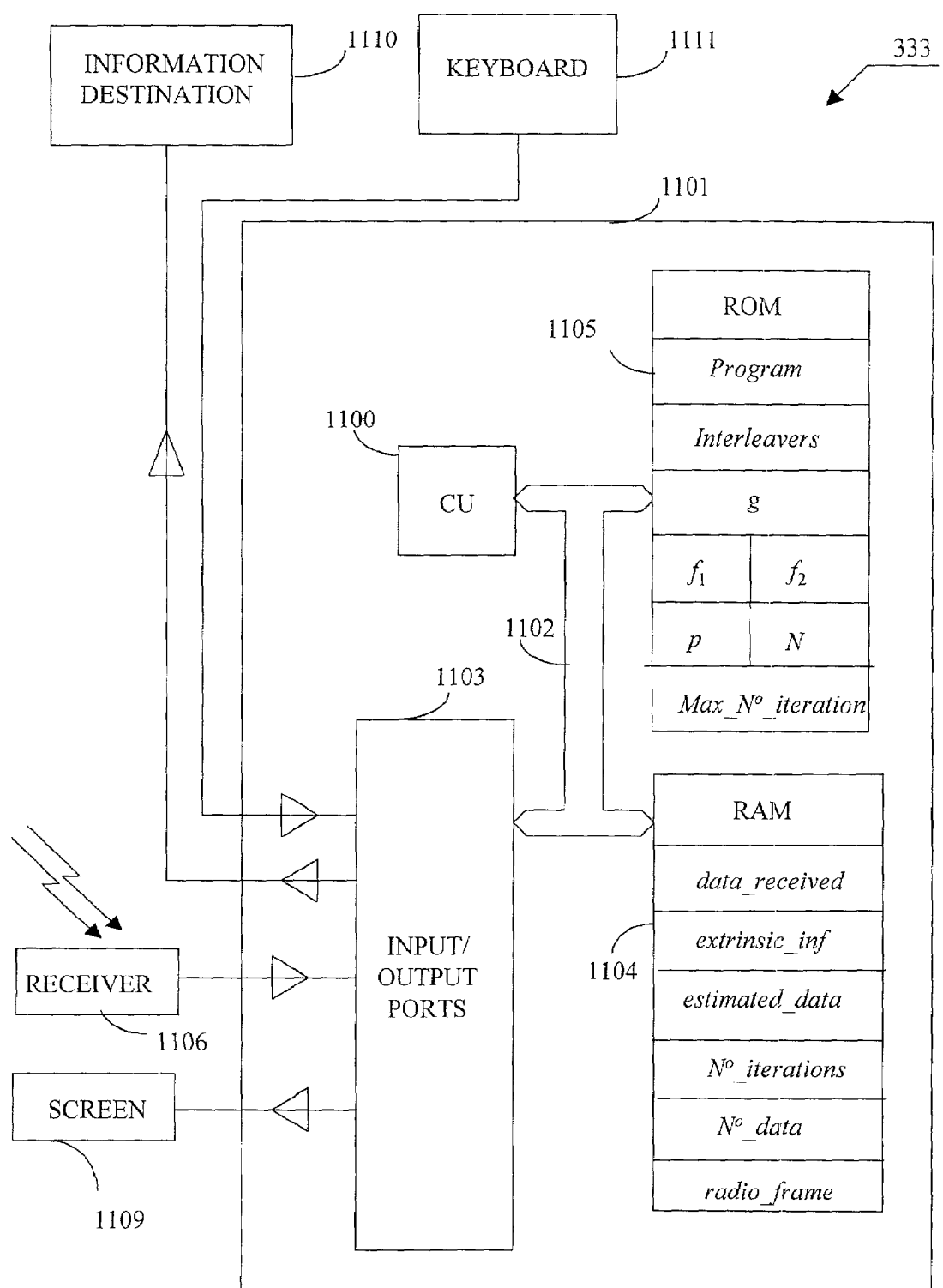
Figure 8:
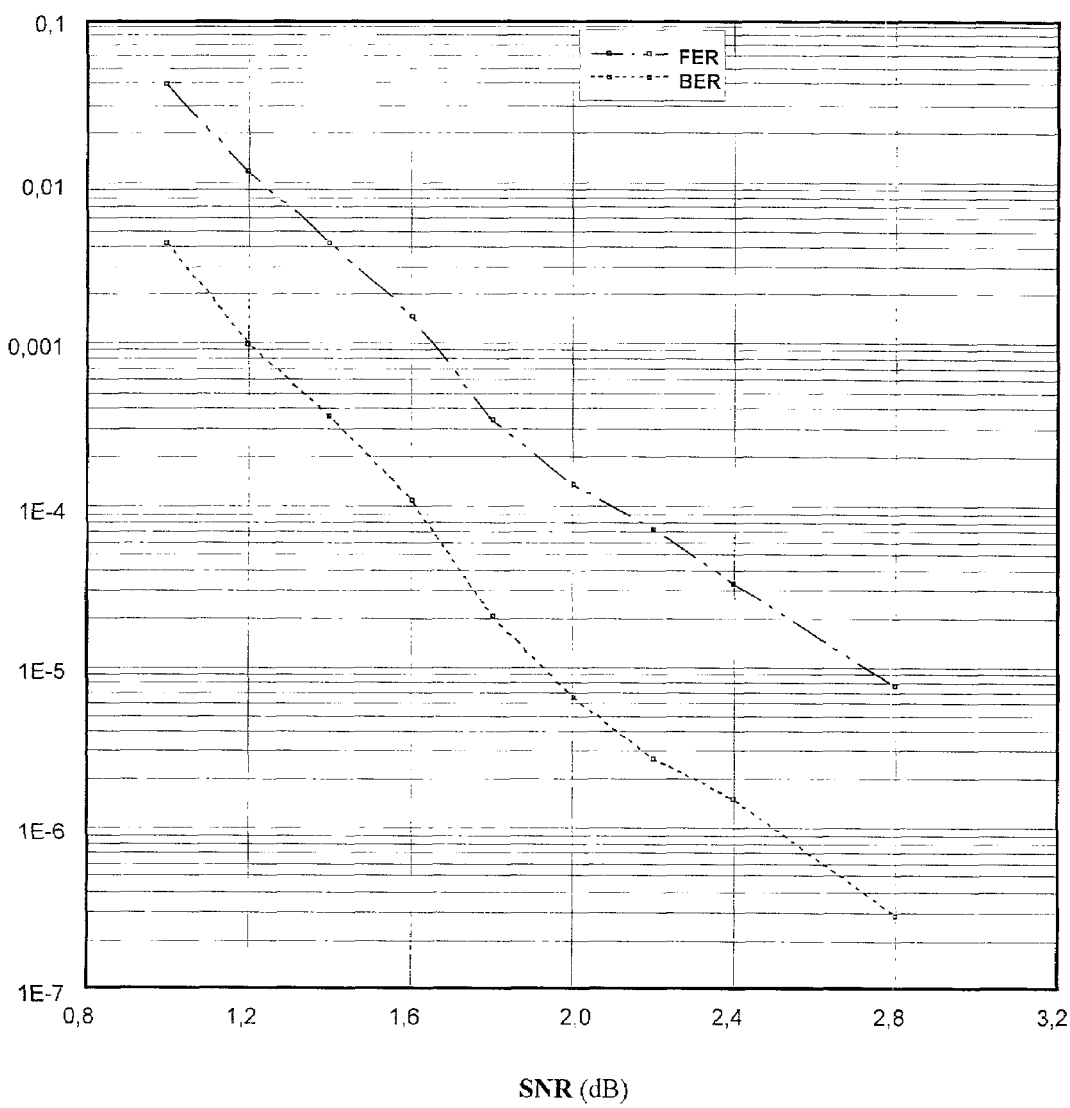

Other aspects and advantages of the invention will emerge from a reading of the detailed description, which will be found below, of a preferred embodiment given by way of non-limitative example. This description refers to the accompanying drawings, in which:

FIG. 1 is a flow diagram illustrating the successive steps leading to the selection of a particular coding method according to an embodiment of the invention, FIG. 2 depicts schematically a coding device according to an embodiment of the invention, FIG. 3a depicts schematically the conventional functioning of the first coder, FIG. 3b depicts schematically the conventional functioning of the second coder, FIG. 4 depicts schematically a digital signal transmission apparatus according to an embodiment of the invention, FIG. 5 depicts schematically a turbodecoding device according to an embodiment of the invention, FIG. 6 depicts schematically a digital signal reception apparatus according to an embodiment of the invention, FIG. 7 depicts schematically an embodiment of a wireless telecommunications network able to implement the invention, and FIG. 8 is a graphic illustrating the results of a simulation of a coding and decoding method according to an embodiment of the invention.

To commence, an explanation will be given, by means of numerical examples, of the mathematical principles on which the invention is based.

Take for example the polynomial $$g(x)=1+x+x^3,$$

of degree d=3, as the recursion polynomial. It divides ($x^7+1$) (the quotient being ($1+x+x^2+x^4$)), but does not divide ($x^N+1$) for N between 1 and 6: the period of this polynomial g(x) is therefore equal to 7.

Take now for example a length of transmitted sequences equal to $$p=14, i.e.: M=p/N=2.$$

To find the possible values of e, there are sought first of all the integers congruent with a power of 2 modulo 7 (N being equal to 7), that is to say congruent with 1, 2 or 4, being limited to the values below 14. (p being equal to 14), which are the only useful values since the different permutations are distinguished by the residues of (i·e) modulo 14; the corresponding values are: 1, 2, 4, 8, 9, and 11. Finally, by eliminating the values 2, 4 and 8, which each have a common divisor with 14 (and which would not give rise, consequently, to a permutation of the 14 indices concerned), it is found that, for this example, the "useful" values of e are 1, 9 and 11.

The example which we have just studied includes a length of sequences which is an even multiple of N, a length incompatible with the methods according to EP 0 928 071. It will now be shown, on the basis of a second example, that the present invention is advantageous compared with this prior art, even in the case where M is odd. Consider therefore, with the same g(x) as above, the case p=63 (i.e.: M=9). It is easily found that the integers e congruent with a power of 2 modulo 63 (and therefore also congruent with a power of 2 modulo 7) which are "useful", are:

e=1, 2, 4, 8, 16, 32.

However, the present invention makes it possible to choose e also from amongst the values:

e=11, 22, 23, 25, 29, 37, 43, 44, 46, 50, 53, 58 corresponding to the integers congruent with a power of 2 modulo 7, but not congruent with a power of 2 modulo 63.

Construct now a permutation according to the invention, for example in the case, studied above, where p=14 and e=9. Taking the residues of (9i) modulo 14 for i between 0 and 13, the following are easily found:

$$a^*_0=a_0,\ a^*_1=a_{11},\ a^*_2=a_8,\ a^*_3=a_5,\ a^*_4=a_2,\ a^*_5=a_{13},$$
$$a^*_6=a_{10},\ a^*_7=a_7,\ a^*_8=a_4,\ a^*_9=a_1,\ a^*_{10}=a_{12},$$
$$a^*_{11}=a_9,\ a^*_{12}=a_6,\ \text{et}\ a^*_{13}=a_3. \quad (1)$$

Examine the effect of this permutation on any sequence of data, for example:

$\underline{u}$=(1, 0, 0, 1, 0, 0, 0, 1, 0, 0, 0).

By extending $\underline{u}$ with the 3 (d being equal to 3) bits (1, 0, 1), there is obtained $\underline{a}$=(1, 0, 0,1, 0, 0, 0, 1, 0, 0, 0,1, 0, 1), that is to say $a(x)=1+x^3+x^7+x^{11}+x^{13}$, which is indeed divisible by g(x) (the quotient being equal to $(1+x+x^2+x^3+x^5+x^7+x^{10})$). Using equation (1), there is then obtained the sequence $\underline{a}^*$ represented by the polynomial $a^*(x)=1+x+x^5+x^7+x^{13}$, which is indeed divisible by g(x) (the quotient being equal to $(1+x^3+x^4+x^6+x^7+x^8+x^{10})$), in accordance with the aim sought by the invention.

It can be shown that, whatever the permutation according to the invention, the appropriate polynomial g*(x) is none other than g(x).

It can thus be seen that the choice first of all of g(x), and then of p, leads, by applying the above rules, to a set "E" of "useful" values of e. All that remains then is to choose the polynomials $f_1(x)$ and $f_2(x)$, and to fix a value of e which is as effective as possible in terms of residual error rate after decoding, in order to obtain a particular turbocoding method according to the invention.

In general terms, the procedure leading to the selection of a method according to an embodiment of the invention will preferably comprise the following steps, described with reference to FIG. 1. At step 1201, a given recursion polynomial g(x) is chosen, as well as the polynomials $f_1(x)$ and $f_2(x)$, on the basis of criteria well known to specialists in recursive coding methods (normally polynomials $f_1(x)$ and $f_2(x)$ with the same degree d as g(x)) are taken). At step 1202, the period N of the polynomial g(x) is calculated. At step 1203, the length p of the coded sequences a to be transmitted is chosen; this length must, according to the invention, be a multiple of N; complying with the technical standards associated with the transmission channel concerned will also normally limit the possibilities of choice. At step 1204, all the "useful" values of e are calculated, that is to say the set E of integers lying between 1 and p which are congruent with a power of 2 modulo N and relatively prime (that is to say without a common divisor) with p. At step 1205, a set "U" of binary sequences $\underline{u}$ is determined, each of length k=p−d, intended to represent all the possible data sequences. It is possible here either to generate such a set according to pre-established rules, or to use a databank where such a set has already been recorded. At step 1206, there are calculated, by padding (as explained above), all the sequences $\underline{a}$ corresponding to the sequences $\underline{u}$ contained in U, so as to constitute a set "A". At step 1207, all the values of e contained in E are considered in turn; for each of them, first of all the associated permutation is calculated, as done in the above numerical example; and then, by multiplication and division of polynomials, all the triplets $\underline{v}$ corresponding to the elements of "A" are calculated, so as to constitute a set "V"; then the binary weight PB of each element of "V" is calculated; finally, the minimum w is determined, amongst all these weights PB, associated with this particular value of e, and the function w(e) is recorded. The optimum value of e for this turbocode, that is to say associated with the greatest possible minimum distance, is finally obtained, at step 1208, by identifying the value of e which supplies the maximum value of the minimum weight w.

FIG. 2 depicts a coding device according to the invention, in which the coding of the data for the purpose of transmission is effected by a turbocoder consisting of two convolutional coders and one interleaver $\pi_1$ (two-parity system).

It will be recalled that a conventional turbocoder consists of two recursive systematic convolutional (RSC) coders, and an interleaver, disposed as shown in FIG. 2. The turbocoder supplies as an output, for each sequence of incoming binary elements $\underline{a}$, three sequences of binary elements ($\underline{a}$, $\underline{b}$, $\underline{c}$), where $\underline{a}$ is the so-called "systematic" output of the turbocoder, that is to say one which has undergone no modification compared with the input signal, $\underline{b}$ is the output coded by the first coder (designated RSC1) and $\underline{c}$ is the output coded by the second coder (designated RSC2) after passing through the interleaver $\pi_1$.

In the preferred embodiment, the signal transporting the sequence of data $\underline{u}$ supplies a padding module 30. This module 30 is responsible for extending the sequence $\underline{u}$ by means of padding bits, as explained below, so as to obtain a sequence $\underline{a}$ whose length p is a multiple of the period N of the polynomial g(x), and where the associated polynomial a(x) is divisible by g(x). The resulting signal then supplies the turbocoder 40. The latter has an interleaver $\pi_1$ according to the invention, that is to say one producing, from the sequence $a$, a permutation $a^*$ divisible by $g(x)$.

The consequence of the methods according to this embodiment of the invention is thus that the final state of each coder (that is to say at the end of the coding of any sequence) is identical to its initial state (at the start of the coding of said sequence), which guarantees a uniform decoding quality for all the bits in the same sequence. The said states of the coders are depicted in FIGS. 3a and 3b.

FIG. 3a is an operating diagram of the first RSC coder (the one producing a sequence $b$ from a sequence $a$), in the case where, for example, $f_1(x)=1+x^2+x^3$, and $g(x)=1+x+x^3$ are taken.

This coder carries three bits $s_1$, $s_2$, and $s_3$ in memory.

FIG. 3b is an operating diagram of the second RSC coder (the one producing a sequence $c$ from a sequence $a^*$), in the case where, for example, $f_2(x)=1+x+x^2+x^3$, and $g^*(x)=1+x+x^3$ are taken.

This coder carries three bits $s^*_1$, $s^*_2$, and $s^*_3$ in memory.

These two RSC coders are illustrated in FIGS. 3a and 3b in the form of delay elements, such as flip-flops for example. These sequences of delay elements fulfil the logic functions represented by multiplication or division by a polynomial. This representation is conventional and well-known to experts.

Finally, the turbocoder 40 sends the three data sequences $a$, $b$, and $c$ thus obtained to the transmitter 906 (see FIG. 4). For more details on turbocodes, reference can usefully be made to:

the article by C. Berrou, A. Glavieux and P. Thitimajshima entitled *"Near Shannon Limit Error-Correcting Coding and Decoding: Turbo-codes"*, ICC '93, Geneva (published by IEEE, Piscataway, N.J., USA, 1993), the article by C. Berrou and A. Glavieux entitled *"Turbo-Codes: General Principles and Applications"*, in *Audio and Video Digital Radio Broadcasting Systems and Techniques*, Proceedings of the Sixth International Seminar of Tirrenia on Digital Telecommunications, R. De Gaudenzi and M. Luise editors, pages 215 to 226 (1993), the article by J. Hagenauer, P. Robertson and L. Papke entitled *"Iterative (Turbo) Decoding of Systematic Convolutional Codes with the MAP and SOVA Algorithms"*, Informationstechnische Gesellschaft (ITG) Fachbericht, pages 21 to 29 (October 1994), the article by J. Hagenauer, E. Offer and L. Papke entitled *"Iterative Decoding of Binary Block and Convolutional Codes"*, IEEE Transactions on Information Theory (published by IEEE, Piscataway, N.J., USA 1996), the article by C. Berrou, S. Evano and G. Battail entitled *"Turbo-block Codes"*, Proceedings of the seminar *"Turbo-Coding"* organized by the Applied Electronics Department of the Institute of Technology of Lund, Sweden)(August 1996), and the article by C. Berrou and A. Glavieux entitled *"Near Optimum Error-Correcting Coding and Decoding: Turbo-Codes"*, IEEE Transactions on Communications, vol. 44, N° 10 pages 1261 to 1271 (published by IEEE, Piscataway, N.J. USA 1996).

FIG. 4 shows, highly schematically, a digital signal transmission apparatus 48 according to an embodiment of the invention. This comprises a keyboard 911, a screen 909, an external information source 910, and a radio transmitter 906, conjointly connected to input/output ports 903 of a coding device 901 which is produced here in the form of a logic unit.

The coding device 901 has, connected together by an address and data bus 902:

a central processing unit 900, a random access memory RAM 904, a read only memory 905, and said input/output ports 903.

Each of the elements illustrated in FIG. 4 is well known to experts in microcomputers and transmission systems and, more generally, information processing systems. These known elements are therefore not described here. It should however be observed that:

the information source 910 could, for example, be an interface peripheral, a sensor, a demodulator, an external memory or another information processing system (not shown), and could for example supply sequences of signals representing speech, service messages or multimedia data, notably of the IP or ATM type, in the form of sequences of binary data, the radio transmitter 906 is adapted to implement a packet transmission protocol on a non-cabled channel, and to transmit these packets over such a channel.

The random access memory 904 stores data, variables and intermediate processing results, in memory registers bearing, in the description, the same names as the data whose values they store. It should be noted, in passing, that the word "register" designates, throughout the present description, both a memory area of low capacity (a few binary data) and a memory area of large capacity (making it possible to store an entire program) within a random access or read only memory.

The random access memory 904 contains notably the following registers:

a register "N°_data" in which the length k of the sequence of data $u$ is stored, a register "a", in which the sequence $a$ obtained by extending $u$ by means of padding bits is stored, a register "$a^*$" in which the interleaved sequence $a^*$ is stored, a register "a, b, c" in which the sequences $a$, $b$ and $c$ resulting from the turbocoding are stored, and a register "radio_frame" in which the entire radio frame to be transmitted is stored.

The read only memory 905 is adapted to store, in registers which, for convenience, have the same names as the data which they store:

the operating program of the central processing unit 900, in a register "program", the coefficients of the polynomial g(x), in a register "g", the coefficients of the polynomial $f_1(x)$, in a register "$f_1$", the coefficients of the polynomial $f_2(x)$, in a register "$f_2$", the length of the sequences $a$ and $a^*$, in a register "p", the permutation defining the interleaver (such as equation (1) above), in a register "interleaver", and the value N of the period of g in a register "N".

FIG. 5 depicts a decoding device 1101 able to decode data supplied by an apparatus such as the one in FIG. 4. The decoding after reception is effected by a turbodecoder consisting of two decoders, two interleavers $\pi_1$, a deinterleaver $\pi_2$, an adder 70 and a decision unit 80; the decoders, which are designated by "Decoder 1" and "Decoder 2" in FIG. 5, can for example be of the BCJR type, that is to say using the Bahl, Cocke, Jelinek and Raviv algorithm, or of the SOVA type (Soft Output Viterbi Algorithm). See *"Optimal Decoding of Linear Codes for Minimizing Symbol Error Rate"*, by L. R. Bahl, J. Cocke, F. Jelinek, and J. Raviv, IEEE Transactions on Information Theory, March, 1974.

A conventional turbodecoder also requires a looping back of the output of the deinterleaver $\pi_2$ onto the input of the first decoder in order to transmit to the first decoder the so-called "extrinsic" information produced by the second decoder.

The turbodecoder 300 receives the coded sequences $a'$, $b'$ and $c'$ coming from a receiver 1106 (see FIG. 6). Once the decoding has ended, the sequence $â$, which is an estimation of the sequence $a$ transmitted by the transmitter 906, is sent to a truncating module 335; this truncator 335, according to an embodiment of the invention, produces a sequence $û$ by removing the last d bits of $â$ (corresponding to the padding bits placed by the module 30 in FIG. 2); finally, this sequence $û$ is sent to an information destination 1110.

The block diagram in FIG. 6 depicts a digital signal reception apparatus 333 according to an embodiment of the invention. The latter comprises a keyboard 1111, a screen 1109, an external information destination 1110, and a radio receiver 1106, conjointly connected to input/output ports 1103 of a decoding device 1101 which is produced here in the form of a logic unit.

The decoding device 1101 has, connected together by an address and data bus 1102:
  a central processing unit 1100,
  a random access memory RAM 1104,
  a read only memory 1105, and
  said input/output ports 1103.

Each of the elements illustrated in FIG. 6 is well known to experts in microcomputers and transmission systems and, more generally, information processing systems. These known elements are therefore not described here. It should, however, be noted that:
  the information destination 1110 could, for example, be an interface peripheral, a display, a modulator, an external memory or other information processing system (not shown), and could be adapted to receive sequences of signals representing speech, service messages or multimedia data notably of the IP or ATM type, in the form of sequences of binary data,
  the radio receiver 1106 is adapted to implement a protocol for the transmission of packets over a non-cabled channel, and to transmit these packets over such a channel.

The random access memory 1104 stores data, variables and intermediate processing results, in memory registers bearing, in the description, the same names as the data whose values they store. The random access memory 1104 contains notably the following registers:
  registers "data_received", in which there are respectively stored the received sequences $a'$, $b'$, and $c'$,
  registers "extrinsic_inf", in which there are respectively stored the intermediate decoding sequences output from the Decoder 2 in FIG. 5,
  a register "estimated_data", in which there are stored the decoded sequence $â$ and the corresponding interleaved sequence $â*$,
  a register "N°_iterations", in which there is stored the value of the number of iterations already effected by the turbodecoder,
  a register "N°_data" in which there is stored the length of the sequence $û$ issuing from the truncator 335, and
  a register "radio_frame" in which there is stored the entire radio frame received.

The read only memory 1105 is adapted to store, in registers which, for convenience, have the same names as the data which they store:
  the operating program of the central processing unit 1100, in a register "program",
  the coefficients of the polynomial g(x), in a register "g",
  the coefficients of the polynomial $f_1(x)$, in a register "$f_1$",
  the coefficients of the polynomial $f_2(x)$, in a register "$f_2$",
  the length of the sequences $â$ and $â*$ in a register "p",
  the permutation defining the interleaver, in a register "interleaver",
  the value N of the period of g in a register "N", and
  the maximum number of iterations in a register "max_N°_iteration".

It should be noted that, in certain applications, it will be convenient to use the same computer device (functioning in multi-task mode) for the transmission and reception of signals according to the invention; in this case, the units 901 and 1101 will be physically identical.

The methods according to the invention can be implemented within a telecommunications network, as shown in FIG. 7. The network depicted, which can for example consist of one of the future communication networks such as the UMTS networks, consists of a so-called "base station" SB designated by the reference 64, and several "peripheral" stations $SP_i$ (i=1, ..., n, where n is an integer greater than or equal to 1), respectively designated by the references $66_1$, $66_2$, ..., $66_n$. The peripheral stations $66_1$, $66_2$, ..., $66_n$ are distant from the base station SB, each connected by a radio link with the base station SB and able to move with respect to the latter.

The base station SB and each peripheral station $SP_i$ can comprise a coding device 901 as described with reference to FIGS. 4, 5 and 6, a transmission unit and a radio module provided with a conventional transmitter having one or more modulators, filters and an antenna.

The base station SB and each peripheral station $SP_i$ according to the invention can also comprise a decoding device 1101 as described with reference to FIGS. 5 and 6, a reception unit and a radio module with its antenna.

The base station SB and the peripheral stations $SP_i$ can comprise in addition, according to requirements, a digital camera, a computer, a printer, a server, a facsimile machine, a scanner or a digital photographic apparatus.

To end, the results of a coding and decoding simulation according to the invention are presented below. It was first of all sought to obtain the value of e offering to the associated code the greatest minimum distance possible, in this case, which may be useful in practice, where $$g(x)=1+x^2+x^3, \quad f_1(x)=1+x+x^3, \quad f_2(x)=1+x+x^2+x^3, \text{ and}$$
$$p=224 \ (M=32).$$

$w_r$ (e) designates the minimum weight for all the coded sequences $v=(a, b, c)$ associated with the sequences $a$ of weight r and such that a(x) is divisible by g(x). The values of $w_r$ (e) for r=2 and for r=3 have been calculated for each "useful" value of e. These results are given in Table 1.

It can be considered that the value e=71, for which $w_2$=38 and $w_3$=28, is optimum.

The performance of this turbocode on a white Gaussian noise channel was then simulated, for the optimum value of e. The results have been expressed in terms of residual error probability, per frame (Frame Error Ratio FER) on the one hand, and per bit (Bit Error Ratio BER) on the other hand, according to the signal to noise ratio (SNR) per information bit on the channel. They are depicted in FIG. 8.

To implement this simulation, several values of SNR between 0.8 and 2.8 dB were studied. For each of these values of SNR, a certain number of sequences $u$ were generated randomly and, for each of these sequences, the corresponding coded sequence $v=(a, b, c)$ according to the present invention was calculated. On each "noisy" sequence $(a', b', c')$ resulting therefrom, double decoding iterations were performed, 8 in number at least and 50 at most. After the 8 first iterations, the simulation was interrupted as soon as two consecutive (double) iterations gave the same result.

In order to "experimentally" derive the probable value of the minimum distance of the code, the following procedure was carried out. When the decoding was interrupted before the 50$^{th}$ iteration, and when the "estimated" sequence $\hat{a}$ was not identical to the sequence $a$ from which it came, their binary difference, or "error sequence" $d=a+\hat{a}$, was calculated; then the corresponding coded sequence $v=(d, b(d), c(d))$ was calculated according to the present invention; finally, the binary weight PB of this coded sequence $v$ was calculated and this value of PB associated with an erroneous estimation was recorded. This procedure was repeated with as many sequences $u$ as proved necessary to obtain 25 erroneous sequences $\hat{a}$ for each studied value of the signal to noise ratio SNR.

Once the simulation was complete, it was found that none of these sequences $v$ associated with an erroneous estimation had a weight PB less than 28. As is known to experts, this result, combined with the relatively high value of SNR achieved (as can be seen according to the shape of the graphs illustrated in FIG. 8), is a strong indication that the minimum distance of this turbocode must be equal to 28.

What is claimed is:

1. A method of turbocoding for the transmission of information in which, a first polynomial with binary coefficients g(x) of degree d and with a constant term equal to 1 having been predetermined, first the information is presented in the form of binary sequences $u$ of length $$k=p-d,$$

where p is a predetermined multiple of the period N of the polynomial g(x), and then, for each of said sequences $u$, there is produced a triplet $v$ of binary sequences $(a, b, c)$ intended to be transmitted and obtained as follows:

the sequence $a$ is of length p and obtained by extending the sequence $u$ by means of d padding bits so that the polynomial $$a(x) = \sum_{i=0}^{p-1} a_i x^i$$

associated with $a$ is divisible by g(x), the sequence $b$ is represented by the polynomial $$b(x)=a(x) \cdot f_1(x)/g(x),$$

where $f_1(x)$ is a second polynomial with predetermined binary coefficients, without a common divisor with g(x), and the sequence $c$ is represented by the polynomial $$c(x)=a^*(x) \cdot f_2(x)/g^*(x),$$

where $$a^*(x) = \sum_{i=0}^{p-1} a_i x^{\pi(i)},$$

where $\pi(i)$ is a predetermined permutation of the integers i lying between 0 and (p−1), where g*(x) is a third polynomial with predetermined binary coefficients, of degree d and with a constant term equal to 1, $\pi(i)$ and g*(x) being chosen so that, whatever the polynomial a(x) divisible by g(x) (mod. 2), a*(x) is divisible by g*(x) (mod. 2), and where $f_2(x)$ is a fourth polynomial with predetermined binary coefficients, without a common divisor with g*(x), in which there is taken for $\pi(i)$ the residue modulo p of the product (i·e), where e is a predetermined strictly positive integer, relatively prime with p, congruent with a power of 2 modulo N, and not congruent with a power of 2 modulo p, from which it results that g*(x) is identical to g(x).

TABLE 1

| e | 1 | 9 | 11 | 15 | 23 | 25 | 29 | 37 | 39 | 43 | 51 | 53 |
|---|---|---|---|---|---|---|---|---|---|---|---|---|
| $w_2$(e) | 14 | 38 | 22 | 22 | 38 | 38 | 22 | 30 | 38 | 22 | 30 | 22 |
| $w_3$(e) | 10 | 22 | 26 | 34 | 24 | 26 | 28 | 18 | 26 | 30 | 26 | 32 |
| e | 57 | 65 | 67 | 71 | 79 | 81 | 85 | 93 | 95 | 99 | 107 | 109 |
| $w_2$(e) | 38 | 14 | 22 | 38 | 22 | 22 | 22 | 22 | 14 | 22 | 22 | 30 |
| $w_3$(e) | 18 | 62 | 26 | 28 | 34 | 32 | 30 | 30 | 62 | 32 | 28 | 24 |
| e | 113 | 121 | 123 | 127 | 135 | 137 | 141 | 149 | 151 | 155 | 163 | 165 |
| $w_2$(e) | 22 | 38 | 30 | 14 | 38 | 38 | 30 | 22 | 38 | 30 | 22 | 30 |
| $w_3$(e) | 14 | 28 | 26 | 62 | 20 | 22 | 26 | 14 | 20 | 26 | 26 | 22 |
| e | 169 | 177 | 179 | 183 | 191 | 193 | 197 | 205 | 207 | 211 | 219 | 221 |
| $w_2$(e) | 38 | 22 | 30 | 38 | 14 | 14 | 30 | 30 | 22 | 30 | 30 | 22 |
| $w_3$(e) | 18 | 34 | 18 | 24 | 60 | 96 | 26 | 22 | 32 | 24 | 16 | 12 |

2. A device for coding sequences of data intended to be transmitted by means of a turbocoding method according to claim 1, having:

means for obtaining, for each sequence of data $u$, said sequence $a$ associated with $u$ by extending the sequence $u$ by means of said d padding bits, and at least one turbocoder having an interleaver $\pi_1$ able to effect the permutation provided for in said method.

3. An apparatus for transmitting coded digital signals, having a coding device according to claim 2, and means for transmitting the coded sequences $a$, $b$, and $c$.

4. A turbodecoding method, which makes it possible to decode received sequences which are decodable and which have been transmitted after having been coded by means of a turbocoding method according to claim 1.

5. A decoding device intended to implement a turbodecoding method according to claim 4, having:

at least one turbodecoder having two interleavers $\pi_1$ able to effect the permutation provided for in said method, and a deinterleaver $\pi_2$ able to reverse the permutation; and means for producing a binary sequence $\hat{u}$ by removing the last d bits of the estimated sequence $\hat{a}$ obtained at the end of the turbodecoding of the received sequences $a'$, $b'$ and $c'$ corresponding respectively to the transmitted sequences $a$, $b$, and $c$.

6. An apparatus for receiving coded digital signals, having a decoding device according to claim 5, and means for receiving the sequences $a'$, $b'$, and $c'$.

7. A telecommunications network, having at least one apparatus according to claim 3 or claim 6.

8. A method for determining a turbocoding method in which, a first polynomial with binary coefficients g(x) of degree d and with a constant term equal to 1 having been predetermined, first the information is presented in the form of binary sequences $u$ of length $k=p-d$, where p is a predetermined multiple of the period N of the polynomial g(x), and then, for each of the sequences $u$, there is produced a triplet $v$ of binary sequences ($a$, $b$, $c$) intended to be transmitted and obtained as follows:

the sequence $a$ is of length p and obtained by extending the sequence $u$ by means of d padding bits so that the polynomial $$a(x) = \sum_{i=0}^{p-1} a_i x^i$$

associated with $a$ is divisible by g(x), the sequence $b$ is represented by the polynomial $b(x)=a(x) \cdot f_1(x)/g(x)$, where $f_1(x)$ is a second polynomial with predetermined binary coefficients, without a common divisor with g(x), and the sequence $c$ is represented by the polynomial $c(x)=a^*(x) \cdot f_2(x)/g(x)$, where $$a^*(x) = \sum_{i=0}^{p-1} a_i x^{\pi(i)},$$

where $f_2(x)$ is a third polynomial with predetermined binary coefficients, without a common divisor with g(x), and where $\pi(i)$ is the residue modulo p of the product $(i \cdot e^*)$, where $e^*$ is a number determined in the following manner:

a) a certain number of different sequences $u$ are chosen to form a representative set, b) for each strictly positive integer number e less than p, congruent with a power of 2 modulo N and relatively prime with p:

the total binary weight PB of all said triplets of binary sequences $v$ associated with the sequences $u$ belonging to the representative set is calculated, and note is taken of the value w(e), associated with this value of e, of the minimum weight amongst all these binary weights PB, and c) in order to implement the coding, the value $e^*$ of e which is associated with the largest value of the minimum weight w is chosen.

9. A data storage means, which can be read by a computer or a microprocessor, storing instructions of a computer program, which makes it possible to implement a method according to any one of claims 1 to 8.

10. Means of storing data which are removable, partially or totally, which can be read by a computer and/or a microprocessor, storing instructions of a computer program, which makes it possible to implement a method according to any one of claims 1 to 8.

11. A physically-embodied computer program in a form directly executable by a computer, containing instructions such that, when said program controls a programmable data processing device, the instructions cause the data processing device to implement a method according to any one of claims 1 to 8.

* * * * *

UNITED STATES PATENT AND TRADEMARK OFFICE
CERTIFICATE OF CORRECTION

PATENT NO. : 6,993,698 B2 Page 1 of 1
APPLICATION NO. : 09/964657
DATED : January 31, 2006
INVENTOR(S) : Philippe Piret It is certified that error appears in the above-identified patent and that said Letters Patent is hereby corrected as shown below:

COLUMN 14:

Line 10, "said" should read --the--.

COLUMN 16:

Line 41, "1 to 8." should read --1, 4 and 8.--;
Line 46, "1 to 8." should read --1, 4 and 8.--; and
Line 52, "1 to 8." should read --1, 4 and 8.--.

Signed and Sealed this

Fourteenth Day of November, 2006

JON W. DUDAS
*Director of the United States Patent and Trademark Office*